US009601450B2

(12) United States Patent
Miyakoshi et al.

(10) Patent No.: US 9,601,450 B2
(45) Date of Patent: Mar. 21, 2017

(54) SEMICONDUCTOR PACKAGE

(71) Applicant: J-DEVICES CORPORATION, Oita (JP)

(72) Inventors: Takeshi Miyakoshi, Kanagawa (JP); Sumikazu Hosoyamada, Kanagawa (JP); Yoshikazu Kumagaya, Kanagawa (JP); Tomoshige Chikai, Kanagawa (JP); Shingo Nakamura, Kanagawa (JP); Hiroaki Matsubara, Kanagawa (JP); Shotaro Sakumoto, Kanagawa (JP)

(73) Assignee: J-DEVICES CORPORATION, Oita (JP)

( * ) Notice: Subject to any disclaimer, the term of this patent is extended or adjusted under 35 U.S.C. 154(b) by 0 days.

(21) Appl. No.: 14/669,491

(22) Filed: Mar. 26, 2015

(65) Prior Publication Data

US 2015/0279759 A1    Oct. 1, 2015

(30) Foreign Application Priority Data

Mar. 28, 2014 (JP) .................. 2014-069881
Mar. 18, 2015 (JP) .................. 2015-054934

(51) Int. Cl.
*H01L 23/48* (2006.01)
*H01L 23/52* (2006.01)
(Continued)

(52) U.S. Cl.
CPC ............ *H01L 24/17* (2013.01); *H01L 21/486* (2013.01); *H01L 23/36* (2013.01); *H01L 23/3677* (2013.01); *H01L 23/49811* (2013.01); *H01L 23/49827* (2013.01); *H01L 24/13* (2013.01); *H01L 24/45* (2013.01); *H01L 24/73* (2013.01); *H01L 25/105* (2013.01); *H01L 23/49816* (2013.01); *H01L 24/16* (2013.01); *H01L 24/29* (2013.01); *H01L 24/32* (2013.01); *H01L 24/33* (2013.01); *H01L 24/48* (2013.01); *H01L 2224/13013* (2013.01); *H01L 2224/13111* (2013.01); *H01L 2224/13147* (2013.01);
(Continued)

(58) Field of Classification Search
CPC .... H01L 25/0657; H01L 24/17; H01L 23/367
USPC .................................................. 257/738, 777
See application file for complete search history.

(56) References Cited

U.S. PATENT DOCUMENTS 8,916,481 B2 * 12/2014 Gan et al. ............... 438/760
2005/0098891 A1 * 5/2005 Wakabayashi et al. ...... 257/758
2006/0019484 A1 * 1/2006 Chen et al. .............. 438/618

FOREIGN PATENT DOCUMENTS

JP       2010-153651 A    7/2010

* cited by examiner

Primary Examiner — Theresa T Doan
(74) Attorney, Agent, or Firm — Maier & Maier, PLLC

(57) ABSTRACT

A stacked semiconductor package in an embodiment includes a first semiconductor package including a first circuit board and a first semiconductor element mounted on the first circuit board; and a second semiconductor package including a second circuit board and a second semiconductor element mounted on the second circuit board, the second semiconductor package being stacked on the first semiconductor package. The first semiconductor package further includes a sealing resin sealing the first semiconductor element; a conductive layer located in contact with the sealing resin; and a thermal via connected to the conductive layer and located on the first circuit board.

15 Claims, 14 Drawing Sheets

(51) Int. Cl.
 *H01L 23/00* (2006.01)
 *H01L 23/36* (2006.01)
 *H01L 23/367* (2006.01)
 *H01L 23/498* (2006.01)
 *H01L 21/48* (2006.01)
 *H01L 25/10* (2006.01)

(52) U.S. Cl.
 CPC ............ *H01L 2224/16225* (2013.01); *H01L 2224/16227* (2013.01); *H01L 2224/29191* (2013.01); *H01L 2224/29294* (2013.01); *H01L 2224/29339* (2013.01); *H01L 2224/32225* (2013.01); *H01L 2224/32245* (2013.01); *H01L 2224/33181* (2013.01); *H01L 2224/45015* (2013.01); *H01L 2224/45144* (2013.01); *H01L 2224/45147* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2225/1023* (2013.01); *H01L 2225/1041* (2013.01); *H01L 2225/1058* (2013.01); *H01L 2225/1094* (2013.01); *H01L 2924/00014* (2013.01); *H01L 2924/01029* (2013.01); *H01L 2924/15311* (2013.01); *H01L 2924/181* (2013.01); *H01L 2924/3511* (2013.01)

SEMICONDUCTOR PACKAGE

CROSS-REFERENCE TO RELATED APPLICATIONS

This application is based upon and claims the benefit of priority from the prior Japanese Patent Application No. 2014-069881, filed on 28 Mar. 2014, and the prior Japanese Patent Application No. 2015-054934, filed on 18 Mar. 2015, the entire contents of which are incorporated herein by reference.

FIELD

The present invention relates to a mounting technology for a semiconductor package, and specifically, to a structure of a stacked semiconductor package for alleviating heat transfer from a bottom package to a top package.

BACKGROUND

Recently, along with demands for, for example, electronic devices that are more compact and have a higher density and for an improved access speed to semiconductor devices, package on package (PoP) by which a plurality of semiconductor packages are stacked is used (see, for example, Japanese Laid-Open Patent Publication No. 2010-153651). In mobile terminals including mobile phone, smart phones and the like, a stacked semiconductor package including a bottom package that includes a logic chip performing image processing and a top package that includes a memory chip is used.

In such a stacked semiconductor package, the chips may occasionally be close to each other so as to have a distance therebetween of, for example, 1 mm or less. In such a case, heat from the logic chip in the bottom package may be transferred to the memory chip in the top package, and as a result, the memory chip in the top package may malfunction. For this reason, it is desired to alleviate the heat transfer from the bottom package to the top package.

The present invention has an exemplary object of providing a stacked semiconductor package in which heat transfer from a chip in a bottom package to a chip in a top package may be alleviated.

SUMMARY

A stacked semiconductor package in an embodiment according to the present invention includes a first semiconductor package including a first circuit board and a first semiconductor element mounted on the first circuit board; and a second semiconductor package including a second circuit board and a second semiconductor element mounted on the second circuit board, the second semiconductor package being stacked on the first semiconductor package. The first semiconductor package further includes a sealing resin sealing the first semiconductor element; a conductive layer located in contact with the sealing resin; and a thermal via connected to the conductive layer and located on the first circuit board.

The conductive layer may be located on the sealing resin.

The first semiconductor package may include a plurality of joining electrode terminals joined with the second semiconductor package and located around the first semiconductor element; and the conductive layer may be located inner to the plurality of joining electrode terminals.

The conductive layer may be formed of copper or a copper alloy.

The thermal via may be located inner to the plurality of joining electrode terminals.

The plurality of joining electrode terminals may each include a resin core ball.

The conductive layer may be located also at side surfaces of the first semiconductor package.

The conductive layer may be covered with the sealing resin.

The conductive layer may be located on the first semiconductor element with an adhesive or a space being sandwiched therebetween.

The conductive layer may be a wiring board including at least two layers.

A via may be located in the wiring board including at least two layers and in the sealing resin; and the first circuit board and the second circuit board may be electrically connected to each other by the via.

A via may be located in the sealing resin; and the first circuit board and the second circuit board may be electrically connected to each other by the via and a circuit of the wiring board including at least two layers.

A stacked semiconductor package in an embodiment according to the present invention includes a first semiconductor package including a first circuit board and a first semiconductor element mounted on the first circuit board; and a second semiconductor package including a second circuit board and a second semiconductor element mounted on the second circuit board, the second semiconductor package being stacked on the first semiconductor package. The first semiconductor package further includes a sealing resin sealing the first semiconductor element; and a heat-insulating layer located in contact with the sealing resin.

DESCRIPTION OF EMBODIMENTS

Hereinafter, a stacked semiconductor package according to the present invention will be described with reference to the drawings. The stacked semiconductor package according to the present invention may be carried out in many various embodiments, and is not to be construed as being limited to the following embodiments. In the figures referred to in the following embodiments, the same elements or elements having substantially the same functions will bear the same reference signs, and the descriptions thereof will not be repeated.

Embodiment 1

An overview of a stacked semiconductor package 100 in embodiment 1 according to the present invention will be described in detail with reference to FIG. 1 through FIG. 3. (Basic Structure of the Stacked Semiconductor Package)

Figure 1:
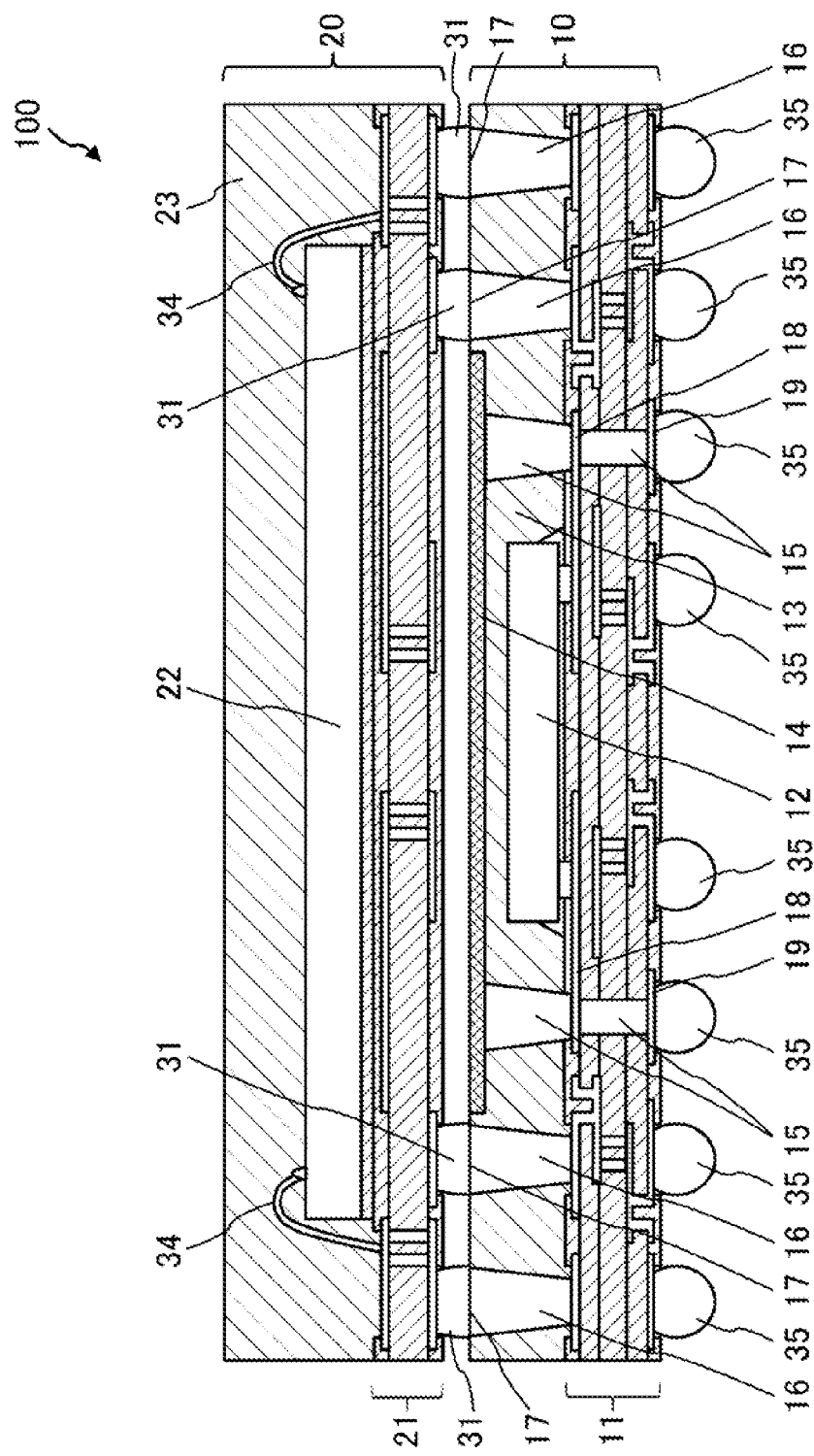
FIG. 1 is a cross-sectional view of a stacked semiconductor package in embodiment 1 according to the present invention.
Figure 3:
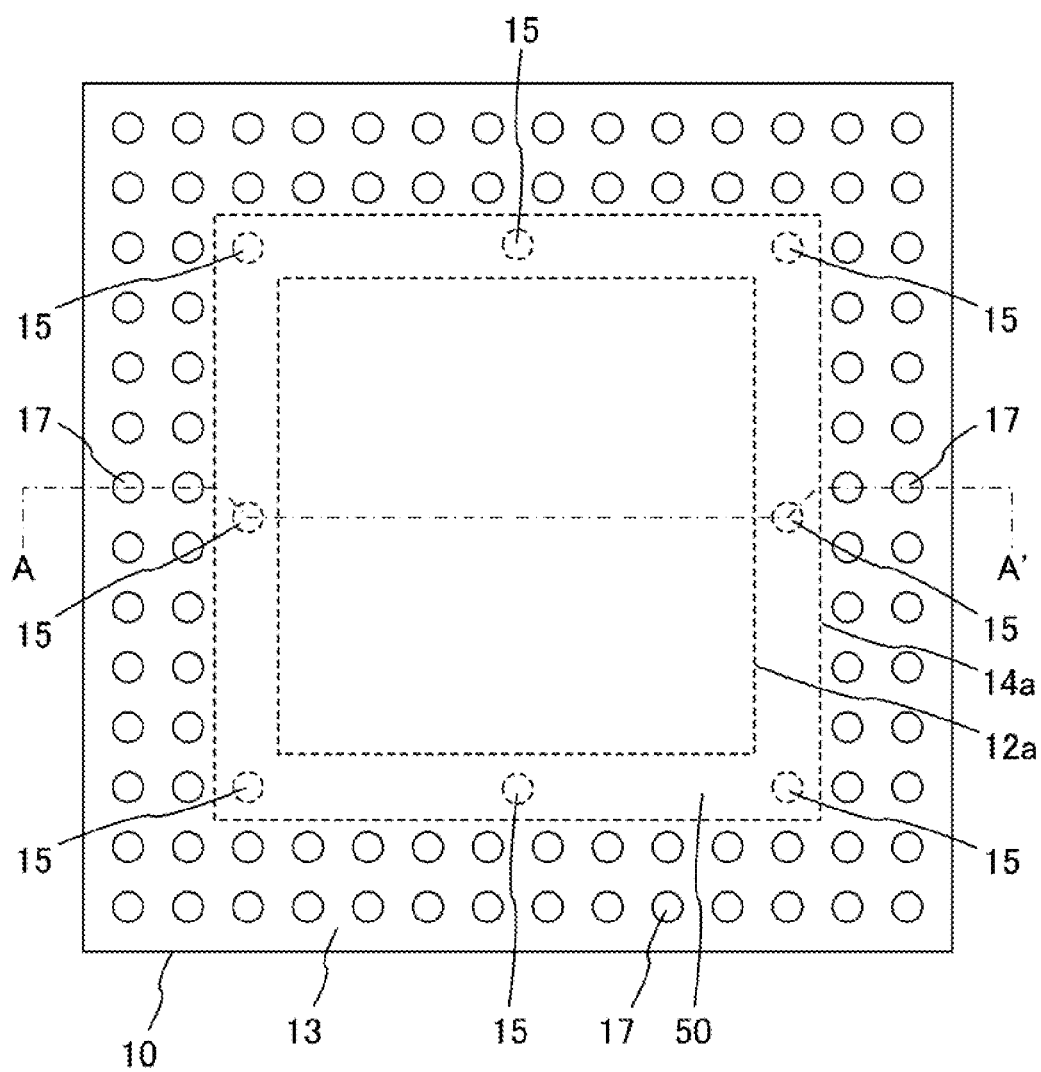
FIG. 3 is a schematic plan view of the stacked semiconductor package in embodiment 1 according to the present invention.

FIG. 1 is a cross-sectional view of the stacked semiconductor package 100 in embodiment 1 according to the present invention, taken along line A-A' in FIG. 3. Referring to FIG. 1, it is seen that a first semiconductor package 10 and a second semiconductor package 20 are joined to each other with solder balls 31 being sandwiched therebetween, and that the second semiconductor package 20 is stacked on the first semiconductor package 10.

The first semiconductor package 10 includes a first circuit board 11 and a first semiconductor element 12 provided on the first circuit board 11. The first circuit board 11 includes one or a plurality of wiring boards. In FIG. 1, the first circuit board 11 includes four wiring boards provided in layers. The first semiconductor element 12 may include, for example, an application processor or the like, but is not limited to having such a structure. In FIG. 1, the first semiconductor element 12 is shown as one element. Alternatively, a plurality of semiconductor elements may be provided as the first semiconductor element 12 on the first circuit board 11.

A sealing resin 13 is provided so as to cover the first circuit board 11 and the first semiconductor element 12. The sealing resin 13 protects the first semiconductor element 12 and a top part of the first circuit board 11 against contamination with external moisture or impurities, and also prevents the first circuit board 11 from being warped. The sealing resin 13 may be formed of an epoxy resin, a cyanate ester resin, an acrylic resin, a polyimide resin, a silicone resin or the like.

A plurality of vias 16 are provided in the sealing resin 13. The vias 16 each have a bottom end contacting an electrode located in the top part of the first circuit board 11 and a top end exposed from the sealing resin 13 and acting as a joining electrode terminal 17. The solder balls 31 are provided on such joining electrode terminals 17 and are connected to electrodes located in a bottom part of a second circuit board 21 in the second semiconductor package 20. In other words, the vias 16 electrically connect lines of the first circuit board 11 in the first semiconductor package 10 and lines of the second circuit board 21 in the second semiconductor package 20 to each other. The vias 16 may be formed as follows, for example. The sealing resin 13 is etched away at predetermined positions to form openings. The openings are filled with a metal material formed by metal plating, etching or the like, and the metal material is bonded to the electrodes located in the top part of the first circuit board 11.

The second semiconductor package 20 includes the second circuit board 21, which includes one or a plurality of wiring boards. A second semiconductor element 22 is provided on the second circuit board 21. The second semiconductor element 22 is electrically connected to lines of the second circuit board 21 by bonding wires 34 formed of Au, Cu or the like. The second semiconductor element 22 includes a memory such as, for example, a flash memory, an SDRAM or the like. A plurality of memories the same type or a plurality of memories of different types may be located side by side on the second circuit board 21 to form the second semiconductor element 22. Alternatively, a plurality of memories may be stacked to form the second semiconductor element 22.

A sealing resin 23 is provided so as to cover the second circuit board 21 and the second semiconductor element 22. The sealing resin 23 is formed of substantially the same material as the sealing resin 13 described above. The electrodes electrically connected to the lines of the second circuit board 21 are located in the bottom part of the second circuit board 21. The electrodes located in the bottom part of the second circuit board 21 and the joining electrode terminals 17 in the first semiconductor package 10 are connected to each other by the solder balls 31, and therefore, the lines of the first circuit board 11 and the lines of the second circuit board 21 are electrically connected to each other by the solder balls 31. Electrodes are provided in a bottom part of the first circuit board 11 and are connected to an external board on which the stacked semiconductor package 100 is to be mounted, by solder balls 35 provided below the electrodes.
(Structure for Alleviating Heat Transfer from the Semiconductor Element on the Bottom Side to the Semiconductor Element on the Top Side)

The stacked semiconductor package 100 in embodiment 1 according to the present invention includes a conductive layer 14 and thermal vias 15 provided in the first semiconductor package 10.

Figure 2:
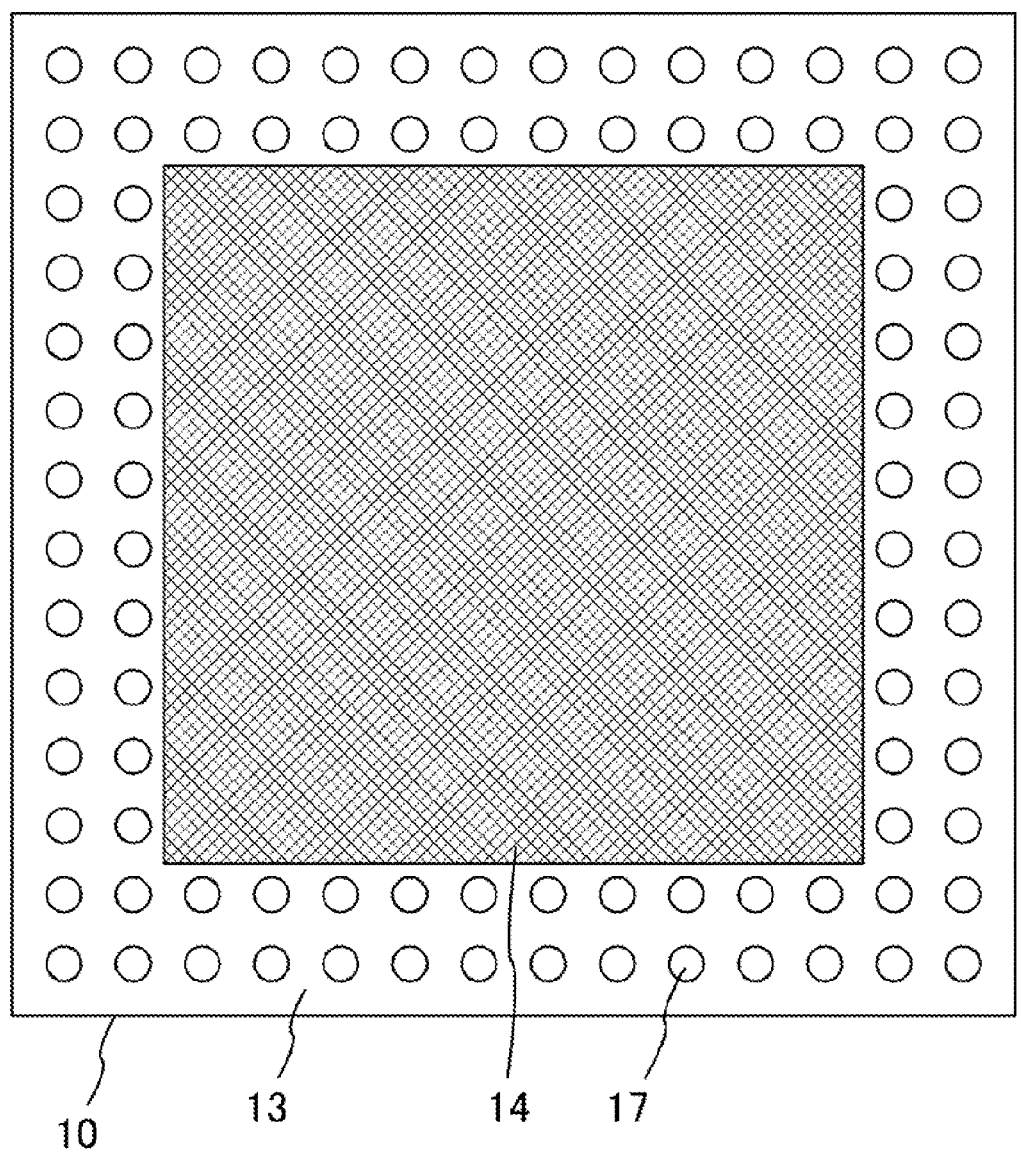
FIG. 2 is a schematic plan view of the stacked semiconductor package in embodiment 1 according to the present invention.

FIG. 2 is a plan view of the first semiconductor package 10 in the stacked semiconductor package 100 in embodiment 1 according to the present invention. As shown in FIG. 2, the plurality of joining electrode terminals 17 are located along an outer perimeter of the first semiconductor package 10, which is square or rectangular. More specifically, the joining electrode terminals 17 are located in two lines along a top side, a bottom side, a left side and a right side of the first semiconductor package 10. As described above, the joining electrode terminals 17 are at the top end of the vias 16 (not shown in FIG. 2). Thus, the vias 16 are arranged in the same manner as the joining electrode terminals 17. It is seen that the conductive layer 14 is located in an inner area of the first semiconductor package 10 so as to be enclosed by the plurality of joining electrode terminals 17 located along the outer perimeter of the first semiconductor package 10.

FIG. 3 is a plan view of the first semiconductor package 10 in the stacked semiconductor package 100 in embodiment 1 according to the present invention. FIG. 3 is a view seen through the conductive layer 14 and shows a planar position of the first semiconductor element 12. An area enclosed by dashed line 14a is the area where the conductive layer 14 is located, and an area enclosed by dashed line 12a is the area where the first semiconductor element 12 is located.

Referring to FIG. 3, it is seen that the conductive layer 14 is located in a larger area than the area where the first semiconductor element 12 is located, so as to cover the entirety of the first semiconductor element 12. The first semiconductor element 12 is square or rectangular, and the conductive layer 14, which is square or rectangular, is located such that an outer perimeter of the conductive layer 14 encloses an outer perimeter of the first semiconductor element 12. Therefore, an area 50 where the conductive layer 14 is located but the first semiconductor element 12 is not located is provided in a square or rectangular frame shape.

The thermal vias 15 are located in the area 50. In FIG. 3, eight thermal vias 15 in total are provided in the vicinity of four corners of the area 50 and in the vicinity of the center of each of four sides of the area 50. The number and the locations in the area 50 of the thermal vias 15 are not limited to the above.

Returning to FIG. 1, it is seen that the conductive layer 14 is formed on a surface of the sealing resin 13, in other words, at a top surface of the first semiconductor package 10. The conductive layer 14 is located inner to the joining electrode terminals 17 (vias 16) located along the outer perimeter of the first semiconductor package 10, and in an area larger than the area where the first semiconductor element 12 is located. The thermal vias 15 are located in the area 50 where the conductive layer 14 is located but the first semiconductor element 12 is not located. A top part of each of the thermal vias 15 is connected to a bottom surface of the conductive layer 14. The conductive layer 14 is formed of a material having a high thermal conductivity, which may be, for example, copper or a copper alloy. The conductive layer 14 may be formed as follows, for example. After the sealing resin 13 is formed, the resin is removed in an area where the conductive layer 14 is to be formed. The resin may be removed by any appropriate method, for example, a mechanical method or a chemical method. Then, a recessed portion provided by the removal is filled with a copper paste, and the copper paste is solidified; or alternatively, a metal plate having a conductive adhesive applied to a surface thereof that is to be connected to the thermal vias 15 is located on, and joined to, the recessed portion.

The thermal vias 15 are formed in the sealing resin 15 and the first circuit board 11. The thermal vias 15 may be formed as follows, for example. First, vias are formed in the first circuit board 11, and after the sealing resin 13 is provided, vias are formed at predetermined positions of the sealing resin 13 by substantially the same method as the vias 16. The vias formed in the first circuit board 11 and the vias formed in the sealing resin 13 do not need to be directly connected to each other, and may have metal elements, lines or the like therebetween. In FIG. 1, lines 18 are provided between the vias formed in the first circuit board 11 and the vias formed in the sealing resin 13. A bottom end of each thermal via 15, more specifically, a bottom end of each via formed in the first circuit board 11 reaches the conductive member 19 provided in the bottom part of the first circuit board 11. The solder balls 35 are located on the conductive members 19, and the stacked-type semiconductor package 100 is connected to an external element by the solder balls 35.

In the stacked semiconductor package 100 in embodiment 1 according to the present invention, heat generated in the first semiconductor element 12 is allowed to escape to below the first semiconductor package 10 through the conductive layer 14 and the thermal vias 15. A part of the heat from the first semiconductor element 12 is transferred to below the first semiconductor package 10. Therefore, heat transfer from the first semiconductor element 12 to the second semiconductor element 22 in the second semiconductor package 20 located above the first semiconductor package 10 is alleviated, and thus the malfunction of the second semiconductor element 22 is suppressed.

(Modification 1)

Figure 4:
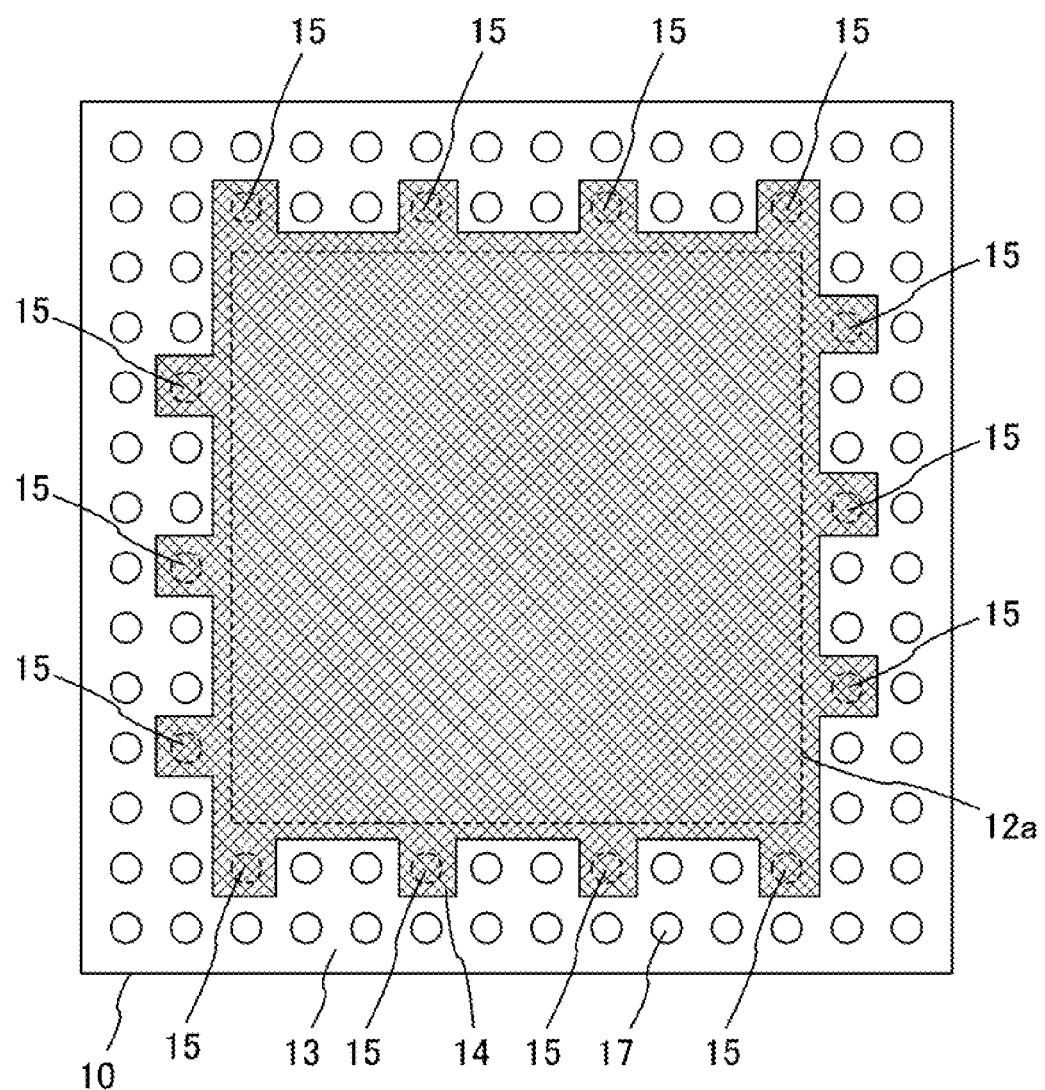
FIG. 4 is a schematic plan view of a stacked semiconductor package in modification 1 of embodiment 1 according to the present invention.

A stacked semiconductor package 100 in modification 1 of embodiment 1 according to the present invention will be described in detail with reference to FIG. 4.

In embodiment 1 described above, the area 50 has a square or rectangular frame shape. The shape of the area 50 is not limited to this. In FIG. 2 and FIG. 3, the joining electrode terminals 17 (vias 16) are located along the outer perimeter of the first semiconductor package 10 in two lines, more specifically, in an inner line and an outer line. By contrast, in FIG. 4, the vias 16 located in the inner line in FIG. 2 and FIG. 3 are partially replaced with thermal vias 15. In FIG. 4, an outer perimeter of the area 50 has square- or rectangular-like protrusions and recesses. Alternatively, the outer perimeter of the area 50 may be wave-shaped.

The above-described structure enlarges the space where the first semiconductor element 12 is located. In addition, the distance between the first semiconductor element 12 and the thermal vias 15 is made shorter. Therefore, the heat generated in the first semiconductor element 12 is transferred more effectively to below the first semiconductor package 10 through the conductive layer 14 and the thermal vias 15.

(Modification 2)

Figure 5:
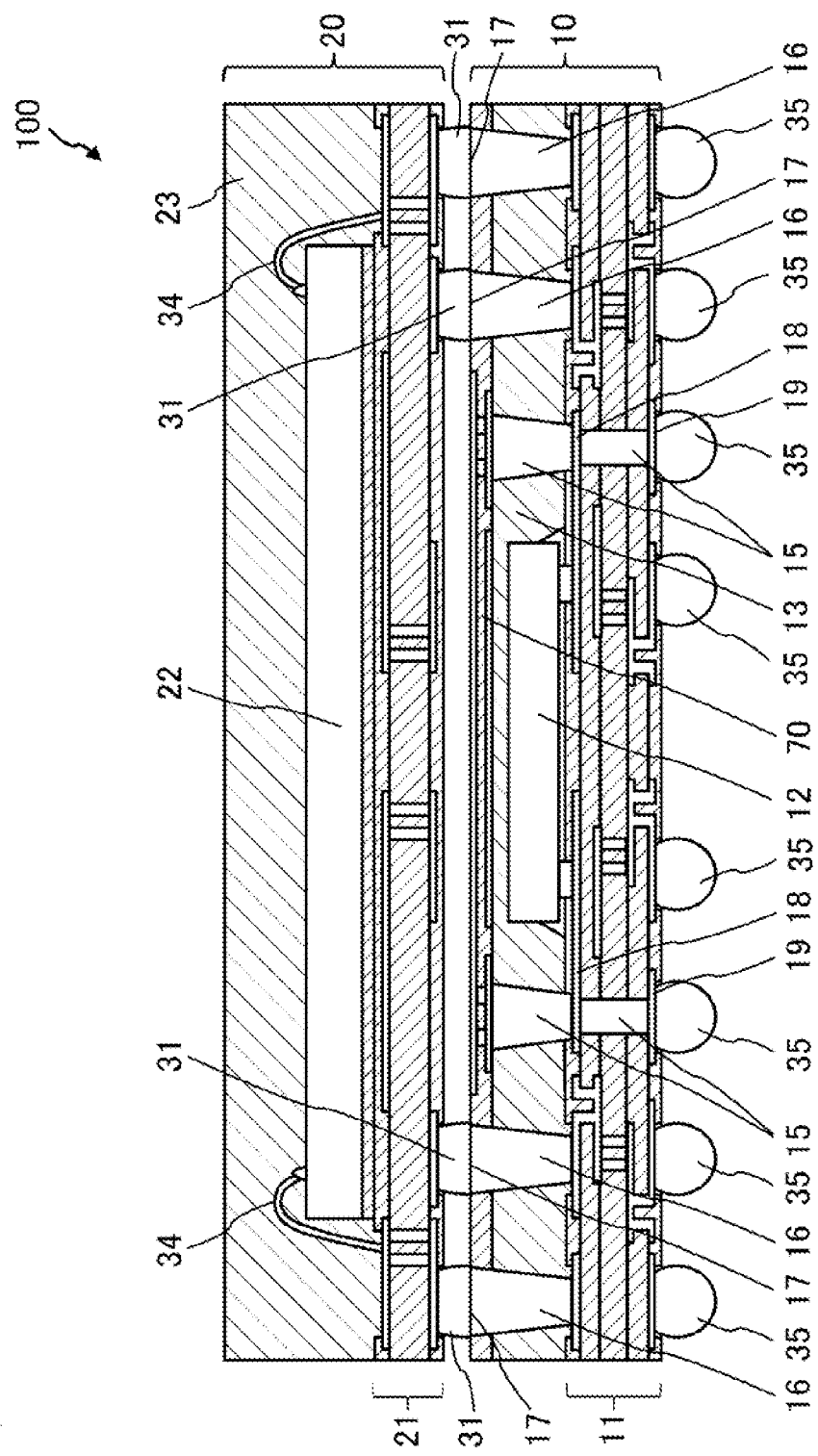
FIG. 5 is a cross-sectional view of a stacked semiconductor package in modification 2 of embodiment 1 according to the present invention.
Figure 6:
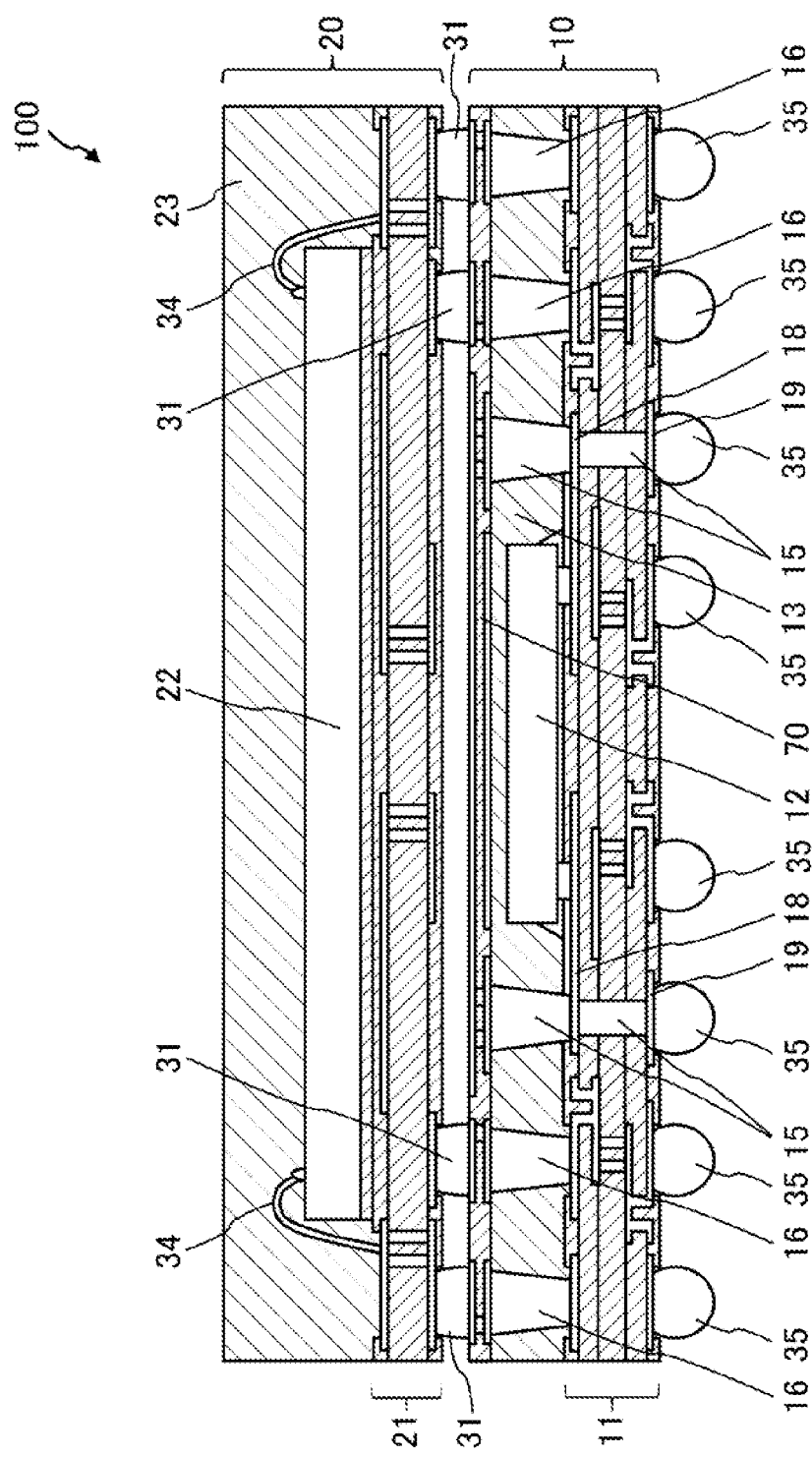
FIG. 6 is a cross-sectional view of another stacked semiconductor package in modification 2 of embodiment 1 according to the present invention.

A stacked semiconductor package 100 in modification 2 of embodiment 1 according to the present invention will be described in detail with reference to FIG. 5 and FIG. 6.

In embodiment 1 described above, the conductive layer 14 is formed of a material having a high thermal conductivity such as, for example, copper or a copper alloy. The conductive layer 14 in the stacked semiconductor package 100 in embodiment 1 according to the present invention is not limited to being formed of a single material as described above. As shown in FIG. 5 and FIG. 6, a wiring board 70 including at least two layers may be provided as the conductive layer 14. In this case, the wiring board including at least two layers may be provided at the entirety of the top surface of the first semiconductor package 10.

In modification 2, the first semiconductor package 10 and the second semiconductor package 20 may be connected to each other in various forms. In the structure shown in FIG. 5, the vias 16 are formed in the wiring board 70 including at least two layers that is located at the top surface of the first semiconductor package 10 and also in the sealing resin 13, and the top ends of the vias 16 and the electrodes located in the bottom part of the second circuit board 21 are connected to each other by the solder balls 31. Alternatively, in the structure shown in FIG. 6, vias are not formed in the wiring board 70, and terminals located in a bottom part of the wiring board 70 and the top ends of the vias 16 located in the sealing resin 13 are connected to each other, and terminals located in a top part of the wiring board 70 and the electrodes located in the bottom part of the second circuit board 21 are connected to each other by the solder balls 31. In this case, lines may be drawn in the wiring board 70 to electrically connect desirable terminals in the first semiconductor package 10 and desirable terminals in the second semiconductor package 20 to each other.

Embodiment 2

An overview of a stacked semiconductor package 100 in embodiment 2 according to the present invention will be described in detail with reference to FIG. 7 and FIG. 8.

Figure 7:
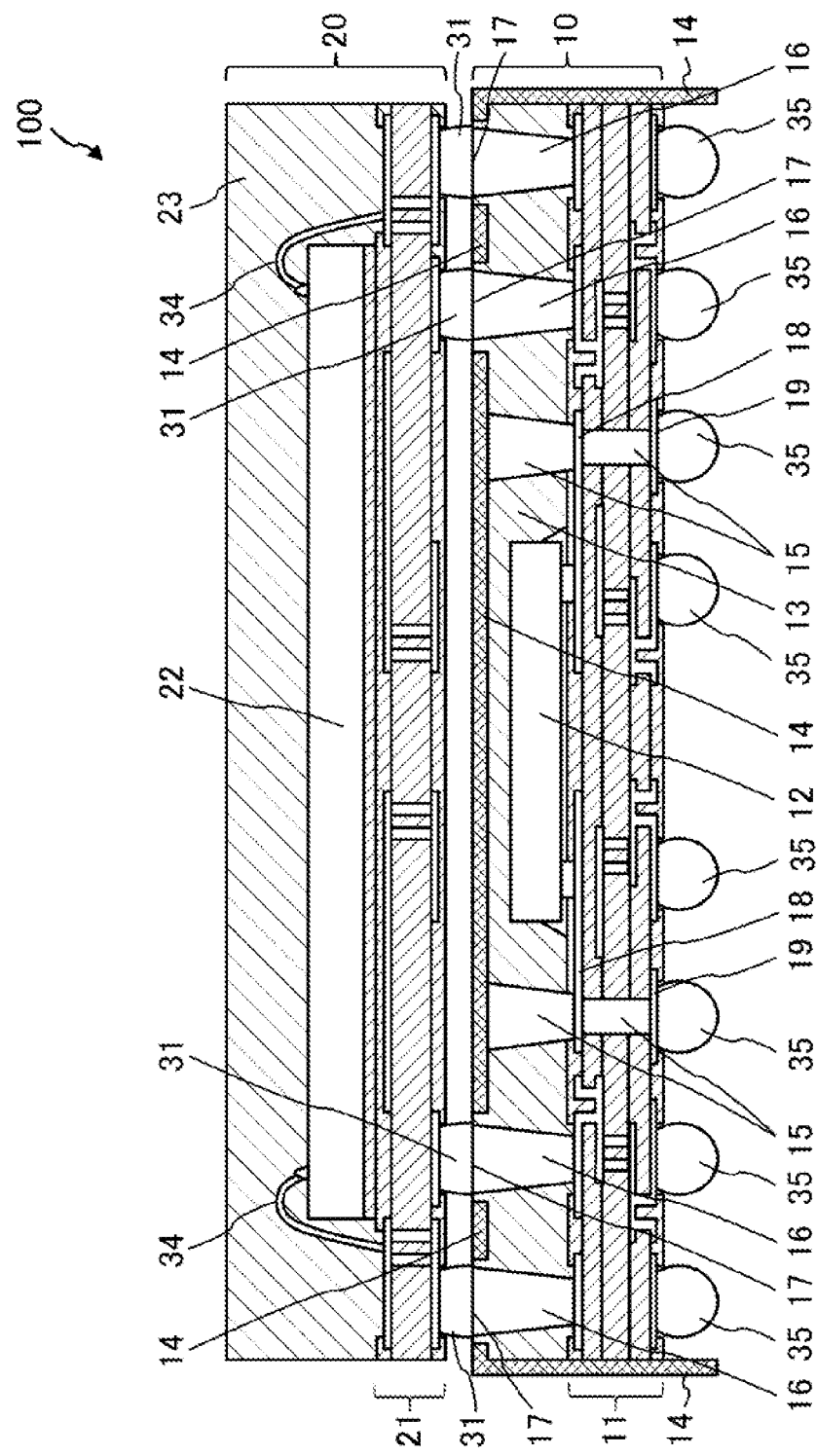
FIG. 7 is a cross-sectional view of a stacked semiconductor package in embodiment 2 according to the present invention.
Figure 8:
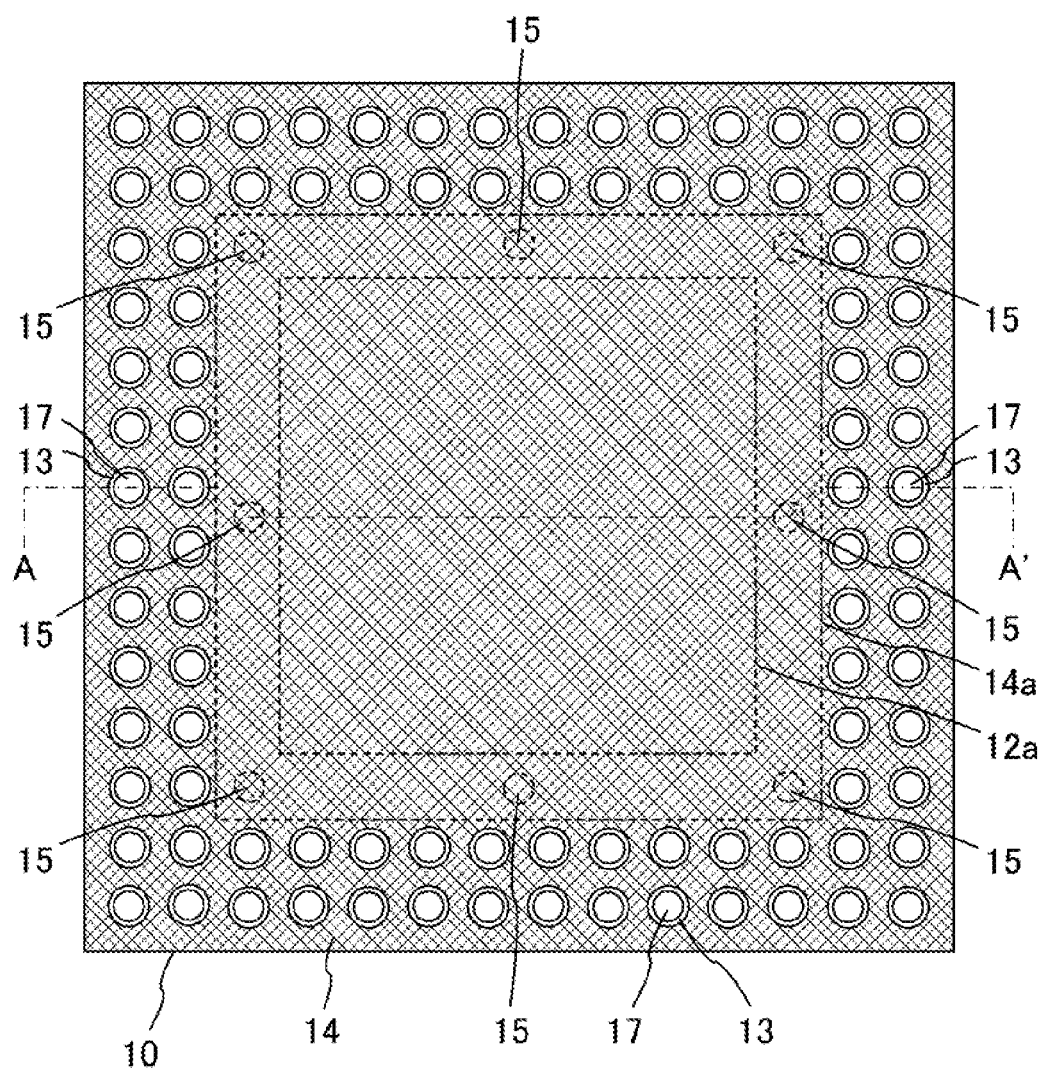
FIG. 8 is a schematic plan view of the stacked semiconductor package in embodiment 2 according to the present invention.

FIG. 7 is a cross-sectional view of the stacked semiconductor package 100 in embodiment 2 according to the present invention, taken along line A-A' in FIG. 8. FIG. 7 is similar to FIG. 1, but is different from FIG. 1 on the following point. In FIG. 7, the conductive layer 14 is provided also in a peripheral area, of the first semiconductor package 10, where the joining electrode terminals 17 are located, such that the conductive layer 14 is not in contact with the joining electrode terminals 17, and is further provided at side surfaces of the first semiconductor package 10.

The conductive layer 14 is located also at the side surfaces of the first semiconductor package 10, more specifically, on side surfaces of the sealing resin 13 and on side surfaces of the first circuit board 11. The first semiconductor package 10, which is square or rectangular as described above, has four side surfaces. It is preferable that the conductive layer 14 is located at all of the four side surfaces. The conductive layer 14 may be formed at the side surfaces as follows, for example. After the sealing resin 13 is formed, metal plates having an adhesive applied to surfaces thereof that are to be connected to the sealing resin 13 are located on, and joined to, the side surfaces of the sealing resin 13 and the first circuit board 11.

FIG. 8 is a plan view of the first semiconductor package 10 in the stacked semiconductor package 100 in embodiment 2 according to the present invention. Referring to FIG. 8, it is seen that the conductive layer 14 is located at the entirety of the top surface of the first semiconductor package 10. However, the sealing resin 13 is located between the conductive layer 14 and the joining electrode terminals 17, and the conductive layer 14 is not electrically connected to the joining electrode terminals 17. As shown in FIG. 8, the conductive layer 14 extends to an outer edge of the first semiconductor package 10, and the conductive layer 14 located at the top surface of the first semiconductor package 10 and the conductive layer 14 located at the side surfaces of the first semiconductor package 10 are connected to each other at the outer edge of the first semiconductor package 10.

As described above, in the stacked semiconductor package 100 in embodiment 2 according to the present invention, the conductive layer 14 is located at the top surface and also at the side surfaces of the semiconductor package 10. This structure allows the heat generated in the first semiconductor element 12 to be transferred to below the first semiconductor package 10 through the conductive layer 14 and the thermal vias 15 and also to be transferred to the side surfaces of the first semiconductor package 10 through the conductive layer 14 located at the side surfaces. This further reduces the amount of heat transferred from the first semiconductor element 12 in the first semiconductor package 10 to the second semiconductor element 22 in the second semiconductor package 20, and thus suppresses the malfunction of the second semiconductor element 22.

From the point of view of heat transfer to the side surfaces of the first semiconductor package 10, it is more preferable that the conductive layer 14 located at the side surfaces has a larger surface area. It is more preferable that a bottom end of the conductive layer 14 located at the side surfaces of the first semiconductor package 10 is connected to a mounting substrate or the like on which the stacked semiconductor package 100 is to be mounted, because such connection allows the heat to be transferred from the conductive layer 14 located at the side surfaces to the substrate.

Embodiment 3

An overview of a stacked semiconductor package 100 in embodiment 3 according to the present invention will be described in detail with reference to FIG. 9.

Figure 9:
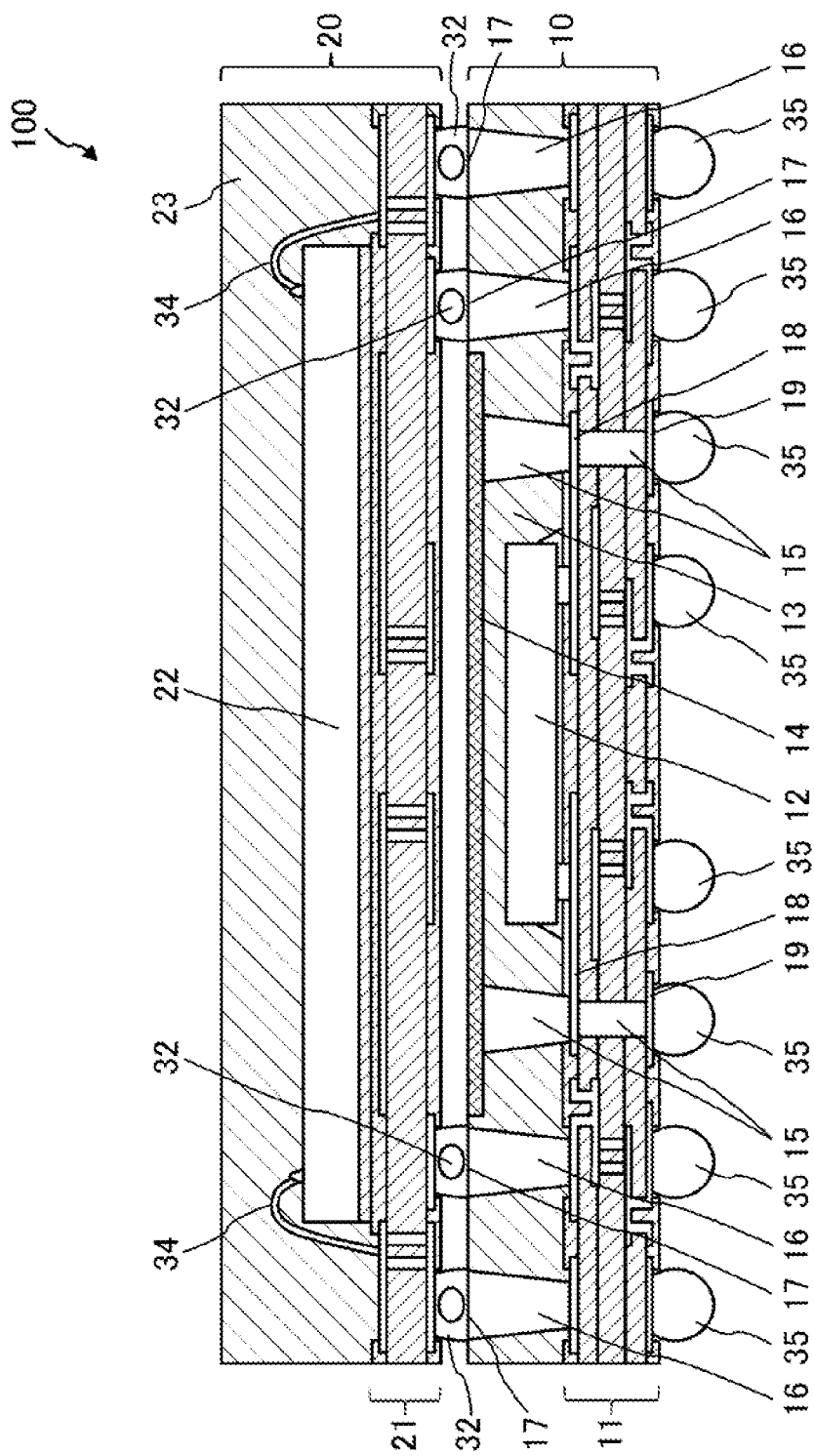
FIG. 9 is a cross-sectional view of a stacked semiconductor package in embodiment 3 according to the present invention.

FIG. 9 is a cross-sectional view of the stacked semiconductor package 100 in embodiment 3 according to the present invention. FIG. 9 is similar to FIG. 1, but is different from FIG. 1 on the following point. In FIG. 9, the first semiconductor package 10 and the second semiconductor package 20 are connected to each other by resin core balls 32.

In FIG. 1, a part of the heat generated in the first semiconductor element 12 is transferred to the second semiconductor element 22 in the second semiconductor package 20 through the solder balls 31. In embodiment 3, the resin core balls 32 having a lower thermal conductivity than that of the solder balls 31 are used to connect to the first semiconductor package 10 and the second semiconductor package 20 to each other. This structure allows the heat generated in the first semiconductor element 12 to be transferred to below the first semiconductor package 10 through the conductive layer 14 and the thermal vias 15 and also reduces the amount of heat transferred to the second semiconductor element 22 in the second semiconductor package 20 through the connection part between the first semiconductor package 10 and the second semiconductor package 20.

Embodiment 4

An overview of a stacked semiconductor package 100 in embodiment 4 according to the present invention will be described in detail with reference to FIG. 10.

Figure 10:
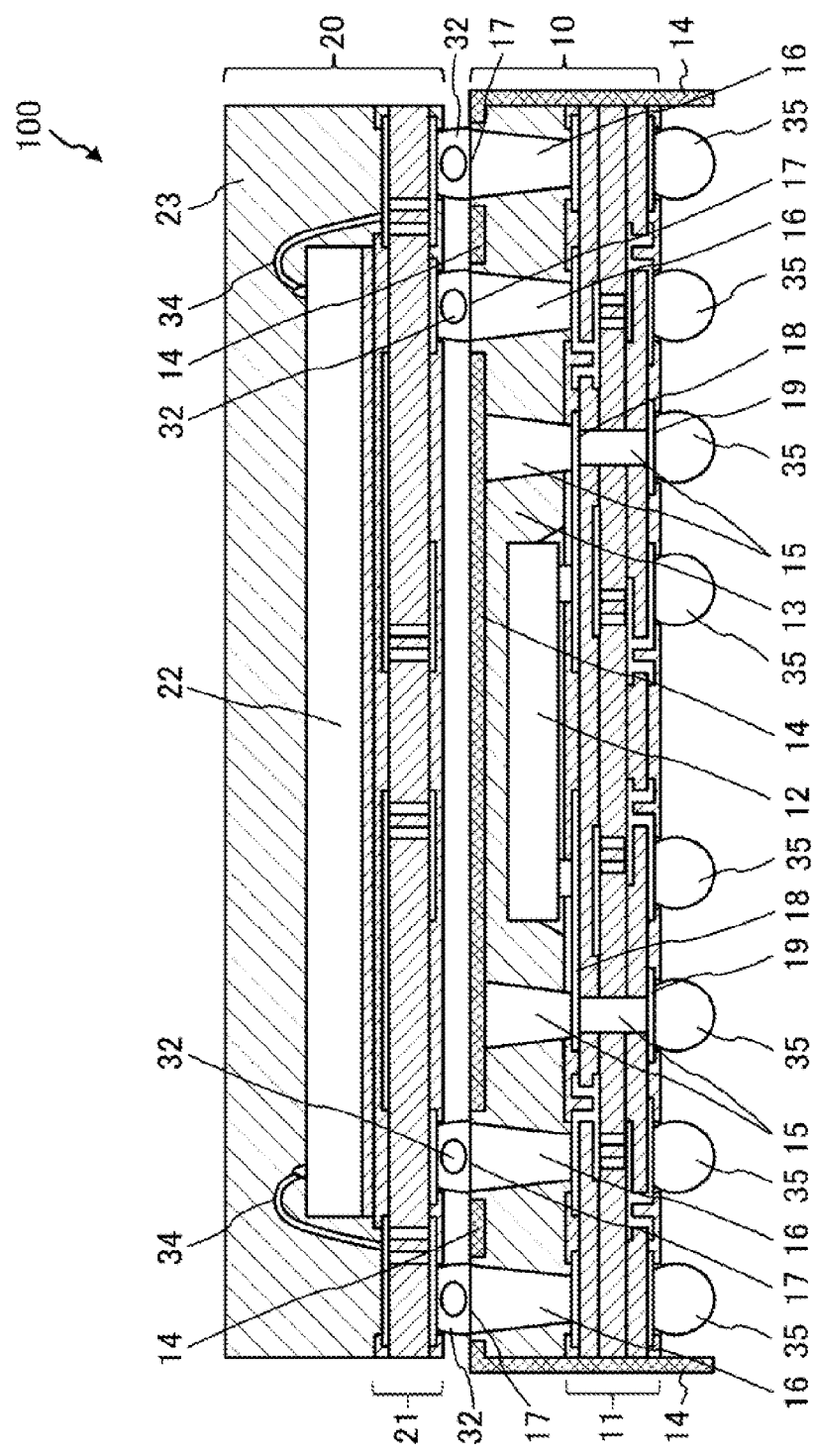
FIG. 10 is a cross-sectional view of a stacked semiconductor package in embodiment 4 according to the present invention.

FIG. 10 is a cross-sectional view of the stacked semiconductor package 100 in embodiment 4 according to the present invention. FIG. 10 is similar to FIG. 1, but is different from FIG. 1 on the following points. In FIG. 10, the conductive layer 14 is located at the side surfaces of the first semiconductor package 10 like in embodiment 2, and the first semiconductor package 10 and the second semiconductor package 20 are connected to each other by the resin core balls 32 like in embodiment 3. The structure of embodiment 4 provides a combination of the effects of embodiment 2 and embodiment 3.

Embodiment 5

An overview of a stacked semiconductor package 100 in embodiment 5 according to the present invention will be described in detail with reference to FIG. 11 and FIG. 12.

Figure 11:
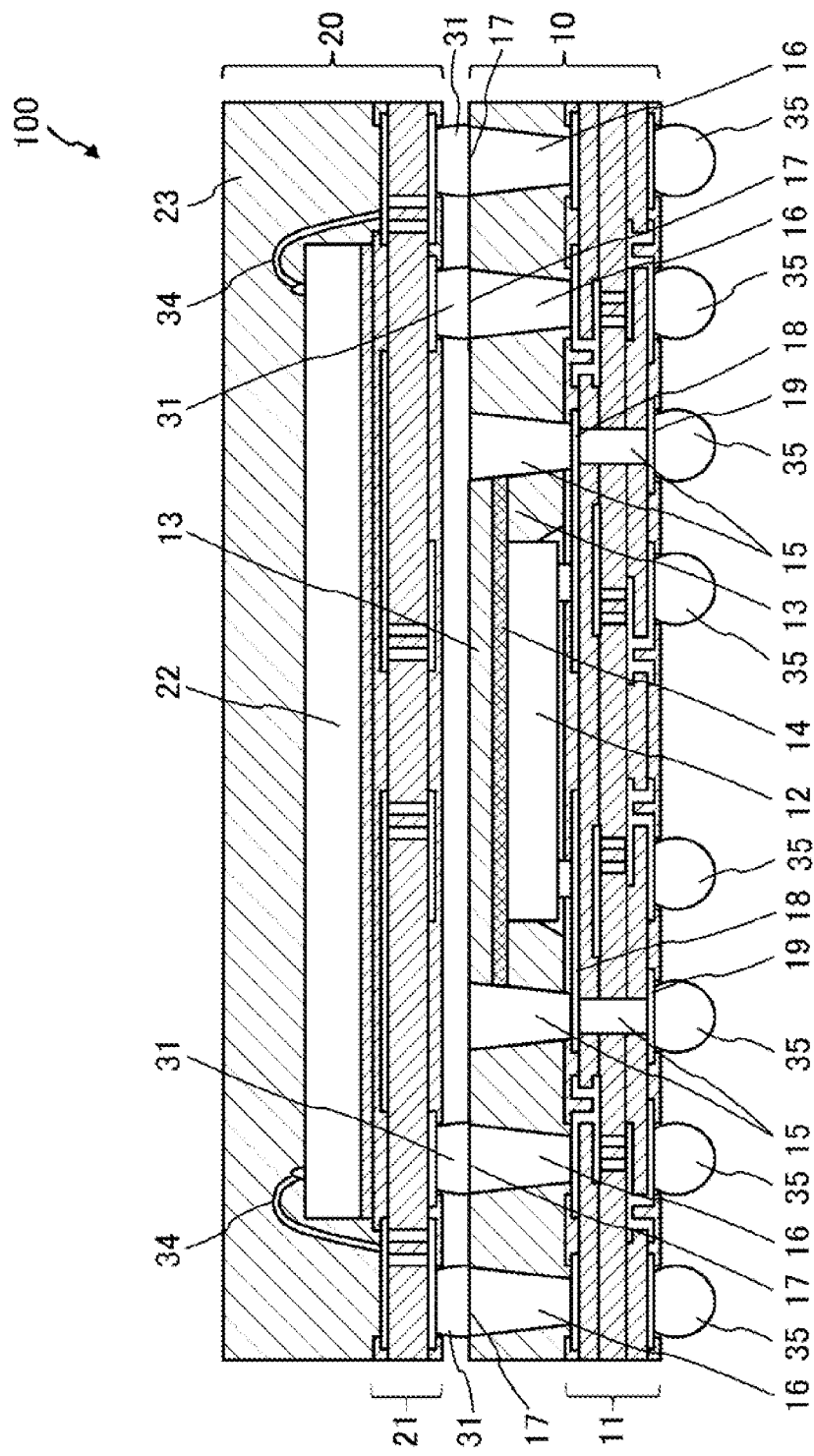
FIG. 11 is a cross-sectional view of a stacked semiconductor package in embodiment 5 according to the present invention.
Figure 12:
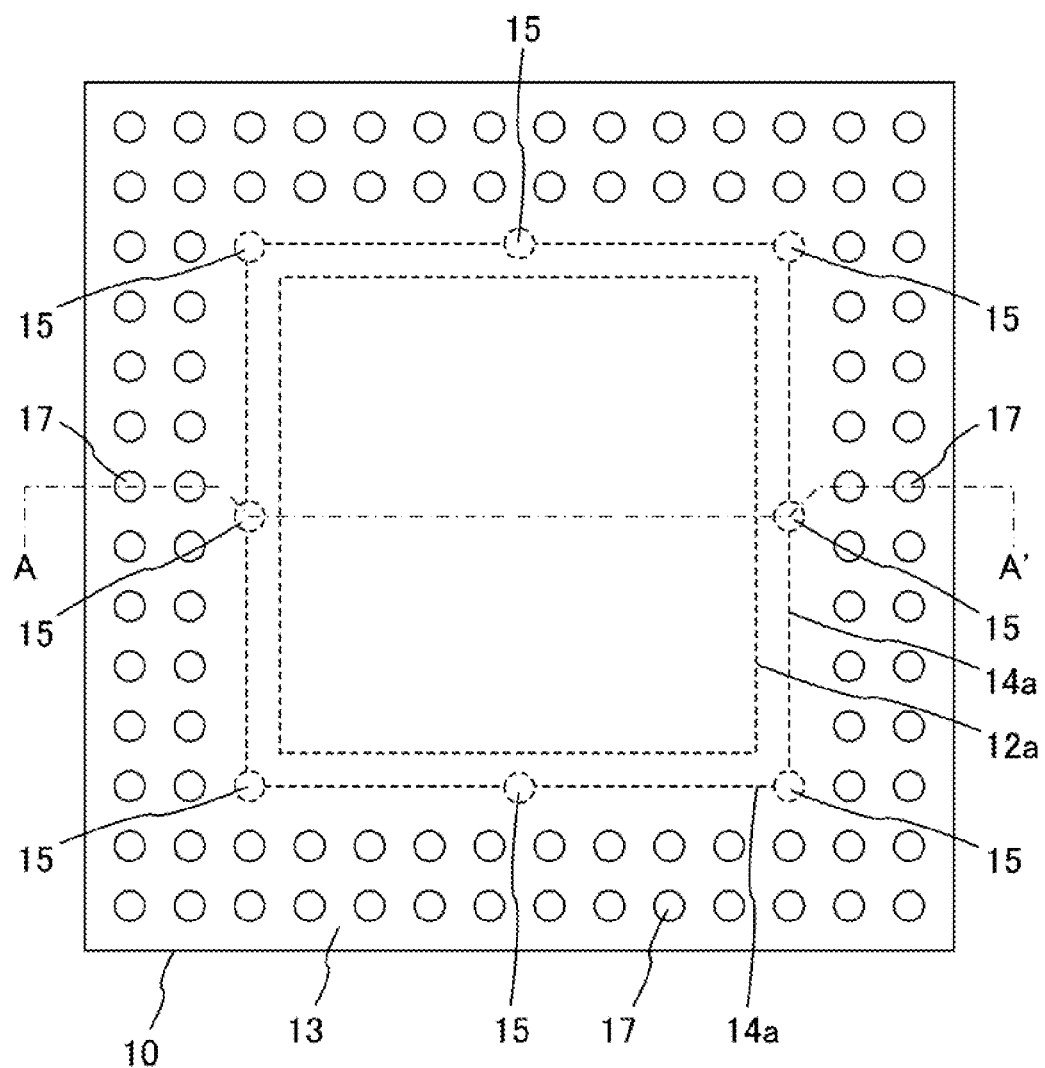
FIG. 12 is a schematic plan view of the stacked semiconductor package in embodiment 5 according to the present invention.

FIG. 11 is a cross-sectional view of the stacked semiconductor package 100 in embodiment 5 according to the present invention, taken along line A-A' in FIG. 12. FIG. 11 is similar to FIG. 1, but is different from FIG. 1 on the following point. In FIG. 11, the conductive layer 14 is located inside the sealing resin 13, not on the surface of the sealing resin 13.

The conductive layer 14 is formed of, for example, a metal plate-like member. The conductive layer 14 is located on the first semiconductor element 12 with an adhesive formed of, for example, an Ag paste or the like being sandwiched therebetween. Alternatively, the conductive layer 14 is located on the first semiconductor element 12 with a spacer or the like formed of silicone or the like being sandwiched therebetween. After the conductive layer 14 is located on the first semiconductor element 12, the sealing resin 13 is formed so as to embed the conductive layer 14 therein. Openings for the thermal vias 15 are formed by etching or the like at predetermined positions of the sealing resin 13. This etching step also removes a part of the conductive layer 14. The openings are filled with a metal material to form the thermal vias 15, and the conductive layer 14 embedded in the sealing resin 13 is connected to the thermal vias 15.

FIG. 12 is a plan view of the first semiconductor package 10 in the stacked semiconductor package 100 in embodiment 5 according to the present invention.

In the stacked semiconductor package 100 in embodiment 5 according to the present invention, the first semiconductor element 12 and the conductive layer 14 are in close contact with each other. This structure allows the heat generated in the first semiconductor element 12 to be directly transferred to the conductive layer 14 and to be effectively transferred to below the first semiconductor package 10 through the thermal vias 15. This further reduces the amount of heat transferred from the first semiconductor element 12 in the first semiconductor package 10 to the second semiconductor element 22 in the second semiconductor package 20, and thus suppresses the malfunction of the second semiconductor element 22.

Embodiment 6

An overview of a stacked semiconductor package 100 in embodiment 6 according to the present invention will be described in detail with reference to FIG. 13 and FIG. 14.

Figure 13:
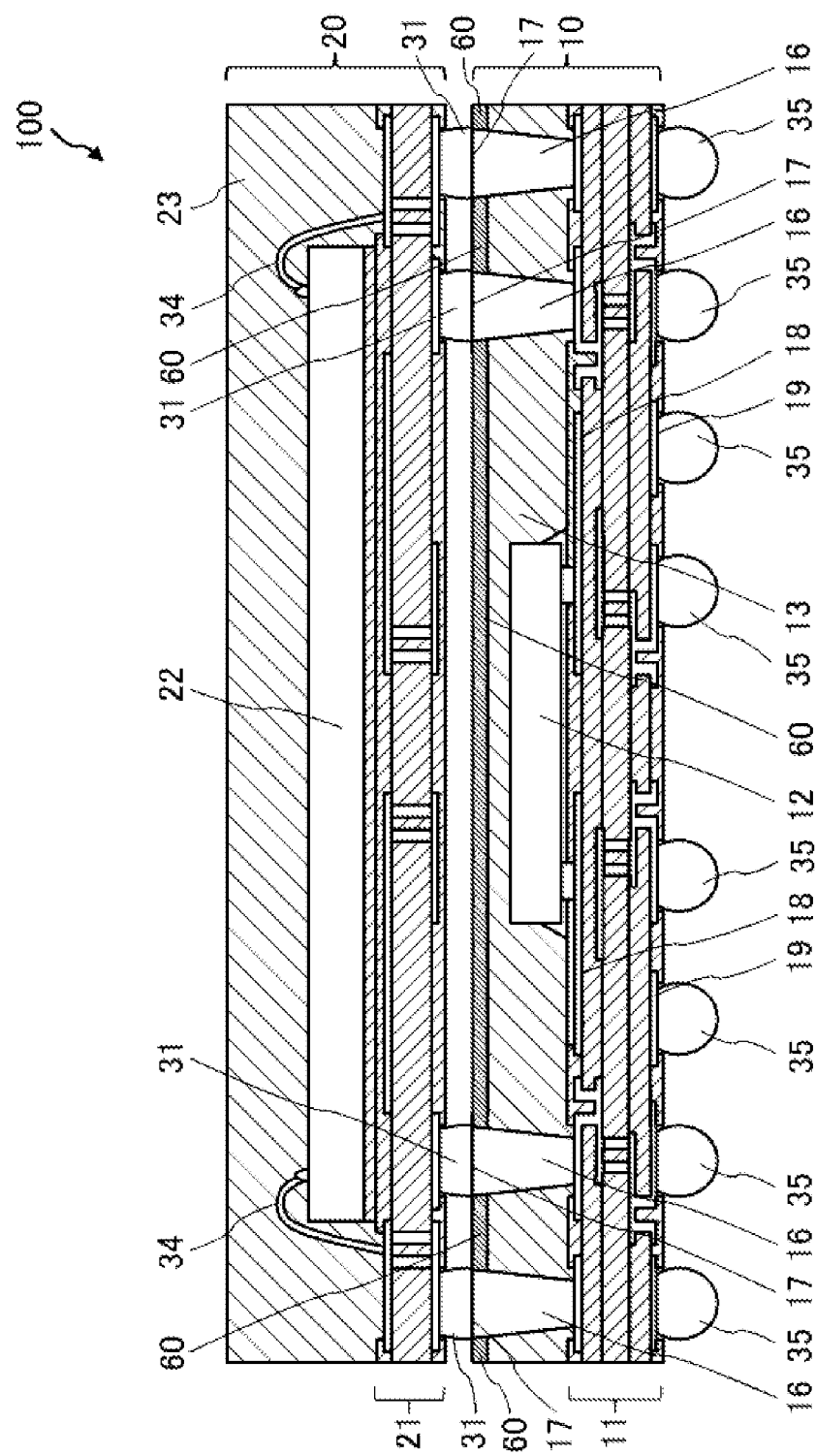
FIG. 13 is a cross-sectional view of a stacked semiconductor package in embodiment 6 according to the present invention.
Figure 14:
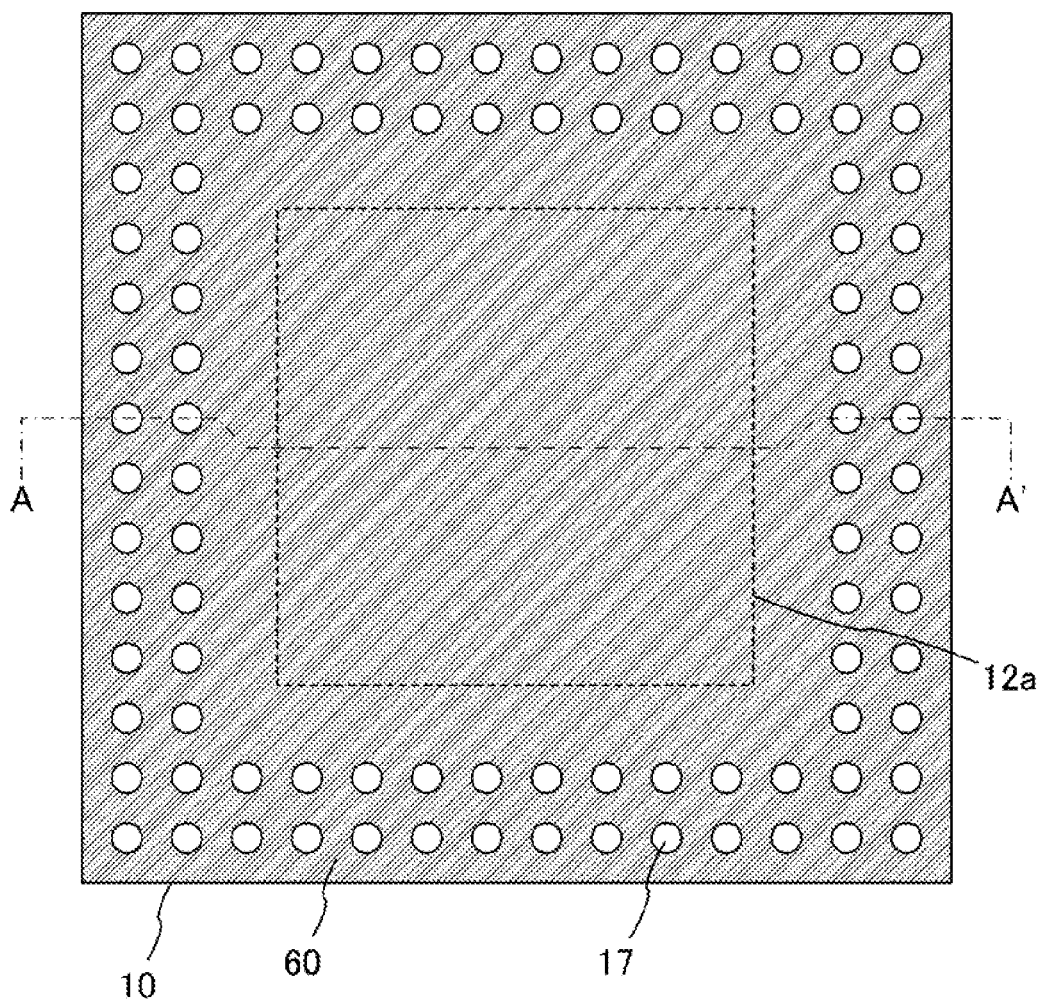
FIG. 14 is a schematic plan view of the stacked semiconductor package in embodiment 6 according to the present invention.

FIG. 13 is a cross-sectional view of the stacked semiconductor package 100 in embodiment 6 according to the present invention, taken along line A-A' in FIG. 14. FIG. 13 is different from FIG. 1 on the following points. In FIG. 1, the conductive layer 14 is provided at the top surface of the first semiconductor package 10. In FIG. 13, a heat-insulating layer 60 is provided at the top surface of the first semiconductor package 10. In addition, in FIG. 13, the thermal vias 15, which are provided in FIG. 1, are not provided.

The heat-insulating layer 60 is formed of a resin having a low thermal conductivity such as, for example, an inorganic insulating material. The thermal conductivity of the sealing resin 13 is about 0.6 [W/mK], whereas the thermal conductivity of the resin having a low thermal conductivity is about 0.2 [W/mK]. Since the thermal conductivity of the heat-insulating layer 60 is lower than that of the sealing resin 13, a larger amount of heat generated in the first semiconductor element 12 is transferred laterally in the sealing resin 13 than toward the second semiconductor element 12. This structure increases the amount of heat transferred to the side surfaces of the sealing resin 13 or to below the first semiconductor package 10 through the first circuit board 11 located below the sealing resin 13. This further reduces the amount of heat transferred from the first semiconductor element 12 in the first semiconductor package 10 to the second semiconductor element 22 in the second semiconductor package 20, and thus suppresses the malfunction of the second semiconductor element 22.

FIG. 14 is a plan view of the first semiconductor package 10 in the stacked semiconductor package 100 in embodiment 6 according to the present invention. FIG. 14 is different from FIG. 8 on the following point. In FIG. 8, the conductive layer 14 is provided at the entirety of the top surface of the first semiconductor package 10 but is not in contact with the joining electrode terminals 17. In FIG. 14, the heat-insulating layer 60 is provided at the entirety of the top surface of the first semiconductor package 10 while being in contact with the joining electrode terminals 17.

As described above, the heat-insulating layer 60 is formed of an insulating resin and therefore may be in contact with the joining electrode terminals 17. For this reason, the vias 16 may be formed as follows during the formation of the first semiconductor package 10. After the sealing resin 13 is formed, the heat-insulating layer 60 is located on the entirety of the surface of the sealing resin 13, and holes are formed at predetermined positions of the heat-insulating layer 60 and the sealing resin 13. Thus, the vias 16 are formed.

<Simulation>

The heat dissipation effect provided by the present invention was analyzed by simulation performed on a conventional PoP device and stacked semiconductor packages in examples 1, 2 and 3 respectively corresponding to embodiments 1, 2 and 5 of the present invention. The results will be described, hereinafter.

Comparative Example

An analysis target in a comparative example was a conventional PoP device including two, namely, top and bottom packages. The top package was a 216-pin BGA package having a chip size of 10.0 [mm]×10.0 [mm]×10.0 [mmt] and an amount of heat generation of 1.5 [W]. The bottom package was a 312-pin BGA package having a chip size of 7.0 [mm]×7.0 [mm]×0.08 [mmt] and an amount of heat generation of 2.5 [W]. As a mounting substrate, a JEDEC-standard 4-layer substrate (101.5 [mm]×114.5 [mm]×1.6 [mmt]) was used. The environmental temperature was 25 [deg C.], the analysis parameter was Tj (highest temperature [deg C.] of each chip). The substrate in the top package was formed of two layers (SR: 0.03; Cu: 0.02; core: 0.05; Cu: 0.02; SR: 0.03), and had a thickness of 0.15 [mm]. The substrate and the chip in the top package were connected to each other by bonding wires (wire diameter: 18 [μm], average length: 1.5 [mm], number of the wires: 300; material: Cu). The resin mold in the top package had a thickness of 0.4 [mm] and a thermal conductivity of 0.6 [W/mK]. The ratio of an area of the substrate covered with the wiring layer with respect to the entire area of the substrate in the top package was Top (L1): 30%; Bottom (L2): 40%. The substrate in the bottom package was formed of four layers (SR: 0.03; Cu: 0.02; core: 0.05; Cu: 0.02; core: 0.06; Cu: 0.02; core: 0.05; Cu: 0.02; SR: 0.03), and had a thickness of 0.3 [mm]. The substrate and the chip in the bottom package were connected to each other by bumps (size: 27×49 [μm]; thickness: 43 [μm]; number of the bumps: 742 pins; material: Cu (30 μm thick)+SnAg (13 μm thick); SnAg was connected to the substrate). The resin mold in the bottom package had a thickness of 0.25 [mm] and a thermal conductivity of 0.6 [W/mK]. The ratio of an area of the substrate covered with the wiring layer with respect to the entire area of the substrate in the bottom package was Top (L1): 30%; L2: 80%; L3: 80%; Bottom (L4): 40%. The solder balls connecting the top package and the bottom package to each other each had a thickness of 0.02 [mm], and the solder balls connecting the bottom package and the mounting substrate to each other each had a thickness of 0.2 [mm]. The solder balls each had a thermal conductivity of 64.2 [W/mK].

Example 1

In Example 1 corresponding to embodiment 1 according to the present invention, the conductive layer was located at the top surface of the bottom package. The conductive layer had a surface area of 10.0 [mm]×10.0 [mm] and a thickness of 0.05 [mm], and was formed of Cu (thermal conductivity: 390 [W/mK]). The thermal vias each had a diameter of 0.15 [mm] and were formed of Cu. A total of 96 thermal vias were located in one line inner to the vias 16 at a pitch of 0.4 [mm] all around the chip in the bottom package. The structure of the stacked semiconductor package in example 1 was substantially the same as that in the comparative example except for the above.

Example 2

In example 2 corresponding to embodiment 2 according to the present invention, the conductive layer was located at the top surface and the side surfaces of the bottom package. The conductive layer at the side surfaces was connected to the mounting substrate. The structure of the stacked semiconductor package in example 2 was substantially the same as that in example 1 except that the conductive layer was located at the side surfaces of the bottom package and was connected to the mounting substrate.

Example 3

In example 3 corresponding to embodiment 5 according to the present invention, the conductive layer was located inside the sealing resin in the bottom package and was in contact with the chip with an adhesive being sandwiched therebetween. The conductive layer had a size of 10.0×10.0× 0.1 [mm] and was formed of Cu (thermal conductivity: 390 [W/mK]). The adhesive connecting the conductive layer and the chip to each other had a thickness of 0.01 [mm] and a thermal conductivity of 60 [W/mK], and was applied to the entirety of the top surface of the chip. The structure of the stacked semiconductor package in example 3 was substantially the same as that in example 1 except for the above.
(Analysis Results)

Table 1 shows the analysis results of the heat dissipation effect on the comparative example, example 1, example 2 and example 3. Tj is the highest temperature of the chip, and θJA is a thermal resistance represented by the expression θJA=(Tj−Ta)/Power. Ta is the environmental temperature (25 [deg C.]), and Power is the total power consumption of the chip in the top package (top chip) and the chip in the bottom package (bottom chip), and is specifically, 4 [W]. The θJA ratio is the ratio of the thermal resistance of each example with respect to the thermal resistance of the comparative example.

TABLE 1

|  | Tj [deg C] | | θJA [deg C/W] | | θJA ratio [%] | |
| --- | --- | --- | --- | --- | --- | --- |
|  | Top chip | Bottom chip | Top chip | Bottom chip | Top chip | Bottom chip |
| Comparative example | 109.5 | 112.6 | 21.1 | 21.9 | Ref. | Ref. |
| Example 1 | 101.1 | 99.4 | 19.0 | 18.6 | −9.9 | −15.1 |
| Example 2 | 94.2 | 92.4 | 17.3 | 16.8 | −18.1 | −23.3 |
| Example 3 | 109.5 | 96.2 | 19.6 | 17.8 | −10.2 | −18.7 |

In Table 1, the highest temperature Tj and the thermal resistance θJA of each example are lower than those of the comparative example. It is seen that the heat transfer from the bottom package to the top package is suppressed. In example 1 (in which the conductive layer is located at the top surface of the bottom package), the θJA ratio of the top chip is −9.9%. This effect is considered to be provided because the conductive layer and the thermal vias allow the heat generated in the chip in the bottom package to be transferred to below the bottom package. Now, the θJA ratio of the top chip in example 1 (in which the conductive layer is located at the top surface of the bottom package) will be compared with that in example 2 (in which the conductive layer is located at the top surface and the side surfaces of the bottom package and the conductive layer at the side surfaces of the bottom package is connected to the mounting substrate). The θJA ratio is −9.9% in example 1 and is −18.1% in example 2. This shows that the thermal resistance in example 2 is reduced from the thermal resistance in the comparative example by twice the level than the level by which the thermal resistance in example 1 is reduced from the thermal resistance in the comparative example. This effect of example 2 is considered to be provided because in example 2, the conductive layer is located at the side surfaces of the bottom package and is connected to the mounting substrate and therefore the heat generated in the bottom chip is transferred to below the bottom package through the conductive layer on the side surfaces as well as through the thermal vias.

Now, the θJA ratio of the top chip in example 1 will be compared with that in example 3 (in which the conductive layer is located inside the sealing resin in the bottom package, and is in contact with the chip with the adhesive being sandwiched therebetween). The θJA ratio is −9.9% in example 1 and is −10.2% in example 3. It is seen that the effect is slightly better in example 3 than in example 1. Comparing the θJA ratio of the bottom chip in example 1 with that in example 3, the θJA ratio is −15.1% in example 1 and is −18.7% in example 3. It is seen that the θJA ratio of the bottom chip is better in example 3 than in example 1.

So far, embodiment 1 through embodiment 6 according to the present invention have been described with reference to FIG. 1 through FIG. 14, and the effects thereof have been investigated by simulation. The present invention is not limited to any of the above embodiments, and may be modified in any way without departing from the gist of the present invention.

What is claimed is:
1. A stacked semiconductor package, comprising:
a first semiconductor package including a first circuit board and a first semiconductor element mounted on the first circuit board; and
a second semiconductor package including a second circuit board and a second semiconductor element mounted on the second circuit board, the second semiconductor package being stacked on the first semiconductor package;
wherein:

the first semiconductor package further includes:
a sealing resin sealing the first semiconductor element;
a conductive layer located in contact with the sealing resin and located above the first semiconductor element and located in a region above a region between two ends of the first semiconductor element; and
a thermal via connected to the conductive layer and located on the first circuit board in an area where the first semiconductor is not located, the conductive layer and thermal via configured to allow heat generated from the first semiconductor element to escape below the first semiconductor package.

2. A stacked semiconductor package according to claim 1, wherein the conductive layer is located on the sealing resin.

3. A stacked semiconductor package according to claim 2, wherein:
the first semiconductor package includes a plurality of joining electrode terminals joined with the second semiconductor package and located around the first semiconductor element; and
the conductive layer is located inner to the plurality of joining electrode terminals.

4. A stacked semiconductor package according to claim 1, wherein the conductive layer is formed of copper or a copper alloy.

5. A stacked semiconductor package according to claim 2, wherein:
the first semiconductor package includes a plurality of joining electrode terminals joined with the second semiconductor package and located around the first semiconductor element; and
the thermal via is located inner to the plurality of joining electrode terminals.

6. A stacked semiconductor package according to claim 2, wherein the plurality of joining electrode terminals each include a resin core ball.

7. A stacked semiconductor package according to claim 2, wherein the conductive layer is located also at side surfaces of the first semiconductor package.

8. A stacked semiconductor package according to claim 1, wherein the conductive layer is covered with the sealing resin.

9. A stacked semiconductor package according to claim 8, wherein the conductive layer is located on the first semiconductor element with an adhesive or a space being sandwiched therebetween.

10. A stacked semiconductor package according to claim 2, wherein the conductive layer is a wiring board including at least two layers.

11. A stacked semiconductor package according to claim 10, wherein:
a via is located in the wiring board including at least two layers and in the sealing resin; and
the first circuit board and the second circuit board are electrically connected to each other by the via.

12. A stacked semiconductor package according to claim 10, wherein:
a via is located in the sealing resin; and
the first circuit board and the second circuit board are electrically connected to each other by the via and a circuit of the wiring board including at least two layers.

13. A stacked semiconductor package according to claim 5, wherein the thermal via is located inside the first circuit board.

14. A stacked semiconductor package according to claim 1, wherein:
the first semiconductor package further includes two pads attached to the first semiconductor element; and
the conductive layer is located in a region above a region between the two pads.

15. A stacked semiconductor package according to claim 1, wherein the conductive layer is located above the first semiconductor element to cover the entire first semiconductor element.

* * * * *